United States Patent
Cui et al.

(10) Patent No.: US 8,653,574 B2
(45) Date of Patent: Feb. 18, 2014

(54) FLASH MEMORY AND METHOD FOR FABRICATING THE SAME

(75) Inventors: Ning Cui, Beijing (CN); Renrong Liang, Beijing (CN); Jing Wang, Beijing (CN); Jun Xu, Beijing (CN)

(73) Assignee: Tsinghua University, Beijing (CN)

( * ) Notice: Subject to any disclaimer, the term of this patent is extended or adjusted under 35 U.S.C. 154(b) by 14 days.

(21) Appl. No.: 13/514,591

(22) PCT Filed: May 22, 2012

(86) PCT No.: PCT/CN2012/075901
§ 371 (c)(1),
(2), (4) Date: Jun. 7, 2012

(87) PCT Pub. No.: WO2013/120329
PCT Pub. Date: Aug. 22, 2013

(65) Prior Publication Data
US 2013/0207173 A1    Aug. 15, 2013

(51) Int. Cl.
*H01L 29/76* (2006.01)

(52) U.S. Cl.
USPC ............ 257/296; 257/314; 257/315; 438/238

(58) Field of Classification Search
CPC ...................................... H01L 29/76
USPC .......... 257/296, E27.084, 314, 315; 365/149, 365/174
See application file for complete search history.

(56) References Cited

U.S. PATENT DOCUMENTS

| | | | |
|---|---|---|---|
| 7,202,521 B2* | 4/2007 | Kim et al. | 257/314 |
| 7,366,026 B2* | 4/2008 | Lee | 365/185.29 |
| 2004/0125629 A1* | 7/2004 | Scheuerlein et al. | 365/17 |
| 2006/0214227 A1* | 9/2006 | Nakajima | 257/347 |
| 2008/0112231 A1* | 5/2008 | Shum | 365/185.27 |
| 2008/0239789 A1* | 10/2008 | Shino et al. | 365/149 |
| 2009/0029511 A1* | 1/2009 | Wu | 438/261 |
| 2010/0117141 A1* | 5/2010 | Shin et al. | 257/326 |

* cited by examiner

*Primary Examiner* — Ajay K Arora
(74) *Attorney, Agent, or Firm* — Houtteman Law LLC

(57) ABSTRACT

A flash memory and a method for fabricating the same are provided. The flash memory comprises: a semiconductor substrate; a storage medium layer formed on the semiconductor substrate and comprising from bottom to top: a tunneling oxide layer, a silicon nitride layer and a blocking oxide layer; a semiconductor layer formed on the storage medium layer and comprising a channel region and a source region and a drain region located on both sides of the channel region respectively; and a gate stack formed on the channel region and comprising a gate dielectric and a gate formed on the gate dielectric.

13 Claims, 5 Drawing Sheets

US 8,653,574 B2

FLASH MEMORY AND METHOD FOR FABRICATING THE SAME

CROSS-REFERENCE TO RELATED APPLICATION

This application claims priority to and benefits of Chinese Patent Application Serial No. 201210034491.2 filed with the State Intellectual Property Office of P. R. China on Feb. 15, 2012, the entire contents of which are incorporated herein by reference.

FIELD

The present disclosure relates to semiconductor design and fabrication field, and more particularly to a flash memory and a method for fabricating the same.

BACKGROUND

A flash memory has a characteristic of no storage data loss (non-volatile) after power failure, and is especially adaptable to fields of mobile communication, computer storage devices, etc. A SONOS flash memory has a structure of Silicon-Oxide-Nitride-Oxide-Silicon (SONOS), in which the ONO comprises one tunneling oxide layer, one silicon nitride layer and one blocking oxide layer. Based on quantum tunneling effect or hot carrier injection effect, charges (electrons or holes) are injected into the silicon nitride layer via the tunneling oxide layer, and captured by charge traps in the silicon nitride layer to change a threshold voltage of a memory cell in the SONOS flash memory, thus realizing data storage. FIG. 1 is a cross-sectional view of a typical SONOS memory cell. As shown in FIG. 1, the structure of the typical SONOS memory cell is that a source 101s and a drain 101d are located at both ends of a substrate 101 respectively and separated by a tunneling oxide layer 103 which is covered by a silicon nitride layer 105, a blocking oxide layer 107 and a gate 101g sequentially, in which the ONO region consisting of the tunneling oxide layer 103, the silicon nitride layer 105 and the blocking oxide layer 107 is a charge storage region. Because the charge storage region is located between the gate 101g and a channel region of an operation region of a transistor, with a continuous scaling down of a size of a semiconductor device, the operation region of the transistor may interfere with the charge storage region, thus causing reduction of a reliability of the device and a data storage lifetime.

SUMMARY

The present disclosure is aimed to solve at least one of the problems, particularly a defect of the fact that an operation region of a transistor interferes with a charge storage region in a conventional SONOS flash memory. Accordingly, a flash memory and a method for fabricating the same are provided, which may enhance a reliability of a device and increase a data storage lifetime.

According to an aspect of the present disclosure, a flash memory is provided. The flash memory comprises: a semiconductor substrate; a storage medium layer formed on the semiconductor substrate and comprising from bottom to top: a tunneling oxide layer, a silicon nitride layer and a blocking oxide layer; a semiconductor layer formed on the storage medium layer and comprising a channel region and a source region and a drain region located on both sides of the channel region respectively; and a gate stack formed on the channel region and comprising a gate dielectric and a gate formed on the gate dielectric.

In one embodiment, the semiconductor substrate is a silicon on insulator (SOI) substrate. The whole flash memory is formed on the SOI substrate, which may help to reduce an electric leakage of the substrate and enhance an electrical performance of the device.

In one embodiment, the semiconductor layer is a silicon layer, that is, the SONOS flash memory is composed by the silicon layer of the SOI substrate, the tunneling oxide layer, the silicon nitride layer, the blocking oxide layer, and the semiconductor layer. A storage medium layer ONO, which is composed by the tunneling oxide layer, the silicon nitride layer and the blocking oxide layer, is formed between the semiconductor substrate and the channel region so as to change a threshold voltage of a memory cell by a substrate bias effect.

In one embodiment, the semiconductor substrate or the silicon on insulator substrate is first type heavily doped, the channel region is second type lightly doped, and the source region and the drain region are first type heavily doped to help to reduce a series resistance of a back electrode.

In one embodiment, a side wall is formed on each side of the gate stack.

In one embodiment, a passivation layer is formed on the semiconductor substrate, the semiconductor layer and the gate, and a plurality of holes are formed in the passivation layer which lead to the semiconductor substrate, the semiconductor layer and the gate respectively.

In one embodiment, a plurality of metallic interconnections are formed on the passivation layer and are connected to the semiconductor substrate, the semiconductor layer and the gate via the plurality of holes respectively.

According to another aspect of the present disclosure, a method for fabricating a flash memory is provided. The method comprises steps of: S1: providing a semiconductor substrate, and first type heavily doping the semiconductor substrate; S2: forming a tunneling oxide layer, a silicon nitride layer and a blocking oxide layer on the semiconductor substrate sequentially; S3: forming a semiconductor layer on the blocking oxide layer, and second type lightly doping the semiconductor layer; S4: forming a gate stack on the semiconductor layer, in which the gate stack comprises a gate dielectric and a gate formed on the gate dielectric, and a region of the semiconductor layer covered by the gate stack is a channel region; and S5: first type heavily doping the exposed semiconductor layer to form a source region and a drain region on both sides of the channel region respectively.

In one embodiment, the semiconductor substrate is a SOI substrate and a silicon layer of the silicon on insulator substrate is first type heavily doped. The whole flash memory is formed on the SOI substrate to help to reduce an electric leakage of the substrate and enhance an electrical performance of the device.

In one embodiment, after the step S1, the method further comprises: etching the silicon layer of the SOI substrate to form a plurality of active regions isolated from each other, that is, in steps S2-S5, one memory cell is formed in one active region, and a plurality of memory cells isolated from each other may be formed on the whole semiconductor substrate and arranged in an array.

In one embodiment, the semiconductor layer is a silicon layer, that is, the SONOS flash memory is composed by the silicon layer of the SOI substrate, the tunneling oxide layer, the silicon nitride layer, the blocking oxide layer, and the semiconductor layer. A storage medium layer ONO, which is composed by the tunneling oxide layer, the silicon nitride layer and the blocking oxide layer, is formed between the semiconductor substrate and the channel region so as to change the threshold voltage of the memory cell by the substrate bias effect.

In one embodiment, after the step S4, the method further comprises: forming a side wall on each side of the gate stack.

In one embodiment, after the step S5, the method further comprises steps of: S6: forming a passivation layer on the semiconductor substrate, the semiconductor layer and the gate, and forming a plurality of holes in the passivation layer which lead to the semiconductor substrate, the semiconductor layer and the gate respectively; and S7: forming a plurality of metallic interconnections on the passivation layer, which are connected to the semiconductor substrate, the semiconductor layer and the gate via the plurality of holes respectively.

With the flash memory and the method for fabricating the same according to an embodiment of the present disclosure, by forming the storage medium layer ONO between the semiconductor substrate and the channel region, the threshold voltage of the memory cell is changed by the substrate bias effect. Because a charge storage region (ONO) and an operation region of a transistor are separated in space, the operation region of the transistor may not interfere with the charge storage region, thus enhancing a reliability of the device and significantly increasing a data storage lifetime of the memory. Moreover, compared with the conventional SONOS flash memory, the flash memory according to an embodiment of the present disclosure has a smaller gate dielectric equivalent oxide thickness (EOT) to help to scale down a size of the device.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
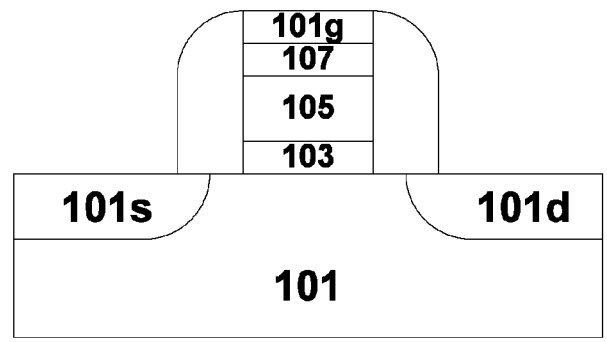
FIG. 1 is a cross-sectional view of a typical SONOS memory cell.

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

It is to be understood that phraseology and terminology used herein with reference to device or element orientation (such as, terms like "longitudinal", "lateral", "front", "rear", "right", "left", "lower", "upper", "horizontal", "vertical", "above", "below", "up", "top", "bottom" as well as derivative thereof such as "horizontally", "downwardly", "upwardly", etc.) are only used to simplify description of the present invention, and do not alone indicate or imply that the device or element referred to must have or operated in a particular orientation.

In addition, terms such as "first" and "second" are used herein for purposes of description and are not intended to indicate or imply relative importance or significance. Therefore, a "first" or "second" feature may explicitly or implicitly comprise one or more features. Further, in the description, unless indicated otherwise, "a plurality of" refers to two or more.

Figure 2:
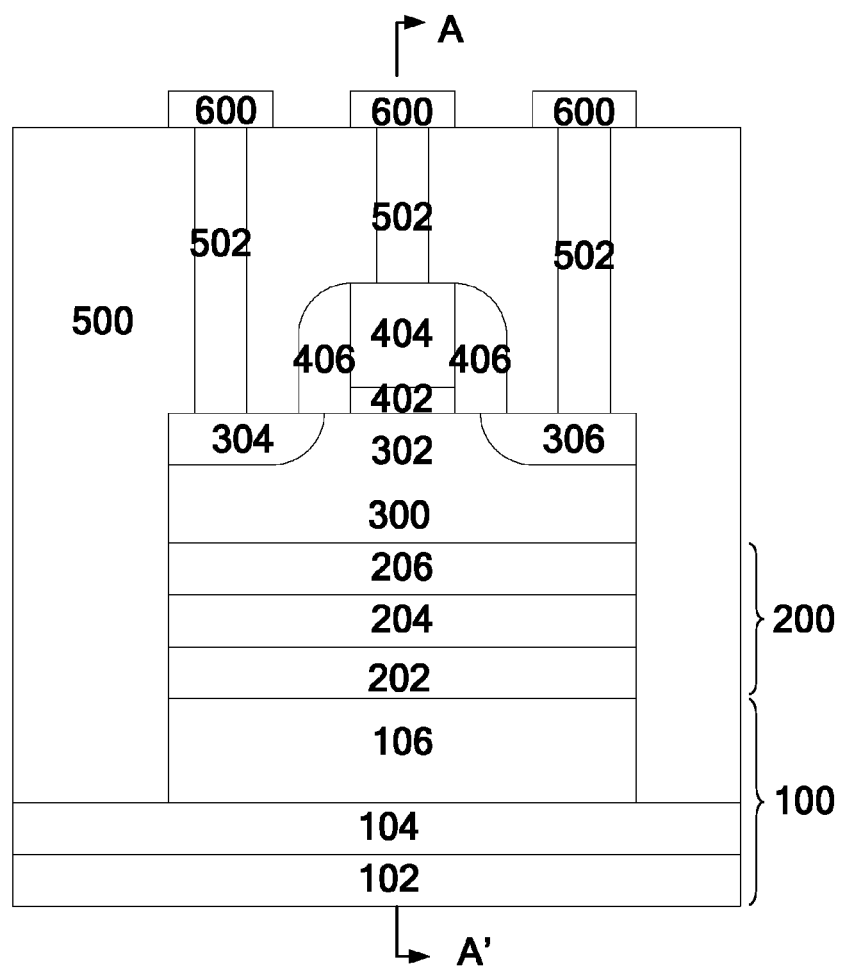
FIG. 2 is a cross-sectional view of a flash memory according to an embodiment of the present disclosure.
Figure 3:
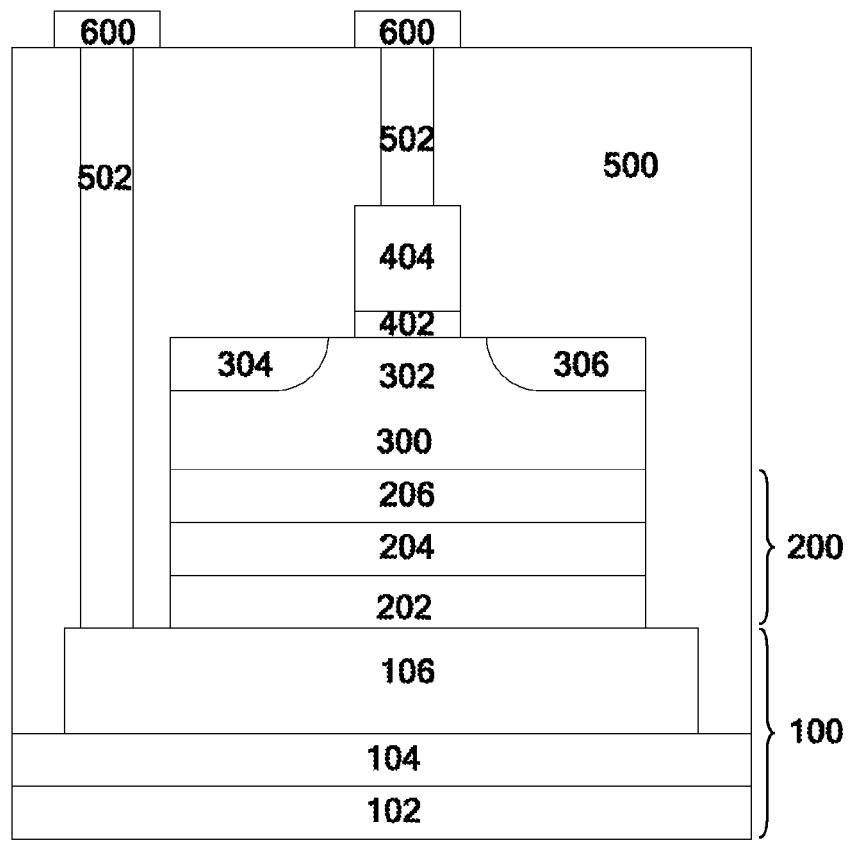
FIG. 3 is a sectional view of the flash memory along an A-A' direction in FIG. 2.

FIG. 2 is a cross-sectional view of a flash memory according to an embodiment of the present disclosure, and FIG. 3 is a sectional view of the flash memory along an A-A' direction in FIG. 2. It should be noted that, either an n-type transistor or a p-type transistor may be applied in the flash memory. For sake of convenience, and merely the n-type transistor is taken as an example in all embodiments of the present disclosure. For a flash memory comprising the p-type transistor, a doping type may be changed correspondingly with reference to the embodiments described herein.

As shown in FIGS. 2-3, the flash memory comprises: a semiconductor substrate 100, a storage medium layer 200, a semiconductor layer 300 and a gate stack.

In one embodiment, the semiconductor substrate 100 may be formed from any conventional semiconductor substrate material, including, but not limited to, silicon, germanium, silicon germanium, gallium arsenide, silicon carbide, indium arsenide or indium phosphide. In addition, the semiconductor substrate 100 may alternatively comprise an epitaxial layer, be changed by a stress to enhance a performance thereof, and comprise a SOI substrate. In one preferred embodiment, the semiconductor substrate 100 is the SOI substrate to help to reduce an electric leakage of the substrate and enhance an electrical performance of a device. The SOI substrate 100 comprises from bottom to top: an insulation layer 102, a buried oxide layer 104 and a silicon layer 106. In this embodiment, the semiconductor substrate 100 or the silicon layer 106 of the SOI substrate 100 is n-type heavily doped to reduce a series resistance of a back electrode.

The storage medium layer 200 is formed on the semiconductor substrate 100. In this embodiment, the storage medium layer 200 is formed on the silicon layer 106 of the SOI substrate 100 and comprises from bottom to top: a tunneling oxide layer 202, a silicon nitride layer 204 and a blocking oxide layer 206.

The semiconductor layer 300 is formed on the storage medium layer 200 and comprises a channel region 302 and a source region 304 and a drain region 306 located on both sides of the channel region 302 respectively. The channel region 302 is p-type lightly doped, while the source region 304 and the drain region 306 are n-type heavily doped. In this embodiment, the semiconductor layer 300 may be a silicon layer, that is, the SONOS flash memory is composed by the silicon layer 106 of the SOI substrate 100, the tunneling oxide layer 202, the silicon nitride layer 204, the blocking oxide layer 206, and the semiconductor layer 300. The storage medium layer 200 (ONO), which is composed by the tunneling oxide layer 202, the silicon nitride layer 204 and the blocking oxide layer 206, is formed between the semiconductor substrate 100 and the channel region 302 to change the threshold voltage of the memory cell by a substrate bias effect. Because the storage medium layer 200 is not connected with the channel region 302, that is, a charge storage region (ONO) and an operation region of a transistor are separated in space, a read operation may not affect the electrical performance of the ONO region, thus enhancing a reliability of the device and increasing a data storage lifetime of the memory. Moreover, compared with a conventional SONOS flash memory, the flash memory according to an embodiment of the present disclosure has a smaller gate dielectric equivalent oxide thickness to help to scale down a size of the device.

The gate stack is formed on the channel region 302 and comprises a gate dielectric 402 and a gate 404 formed on the gate dielectric 402. The gate dielectric 402 may be formed from any material used for fabricating the gate dielectric of the transistor, including, but not limited to, a high k dielectric and silicon oxide. The gate 404 may include, but are not limited to, a polysilicon gate or a metal gate.

It should be noted that, in this embodiment, the silicon layer 106 of the SOI substrate 100 may be patterned into a plurality of active regions isolated from each other (only one active region is shown in FIG. 2 and FIG. 3), and each memory cell is formed in one independent active region so as to totally isolate different memory cells.

In one embodiment, a side wall 406 is formed on each side of the gate stack comprising the gate dielectric 402 and the gate 404. A material of the side wall 406 may comprise silicon nitride, silicon oxide, silicon oxynitride, silicon carbide, fluorine doped silica glass, a low k dielectric (such as silicon carbonitride or carbon-doped silicon oxynitride), or a combination thereof The side wall 406 may have a structure of one or more layers. A passivation layer 500 is formed on the semiconductor substrate 100, the semiconductor layer 300 and the gate 404, and a plurality of holes 502 are formed in the passivation layer 500 which lead to the semiconductor substrate 100, the source region 304 and the drain region 306 of the semiconductor layer 300, and the gate 404 respectively. As shown in FIG. 3, an area of the storage medium layer 200 of one memory cell is smaller than that of the active region of the one memory cell in the semiconductor substrate 100, so that electrodes may be led out from the active region. A plurality of metallic interconnections 600 are formed on the passivation layer 500 and are connected to the semiconductor substrate 100, the source region 304 and the drain region 306 of the semiconductor layer 300, and the gate 404 via the plurality of holes 502 respectively. Preferably, metal silicide may be formed on each of the semiconductor substrate 100, the source region 304 and the drain region 306, and the gate 404. Therefore, ohmic contacts may be formed between the metal silicide and the semiconductor substrate 100, between the metal silicide and the source region 304, between the metal silicide and the drain region 306, and between the metal silicide and the gate 404 respectively to reduce contact resistances between a metal in the holes 502 and the semiconductor substrate 100, between the metal in the holes 502 and the source region 304, between the metal in the holes 502 and the drain region 306, and between the metal in the holes 502 and the gate 404 respectively.

A method for fabricating a flash memory according to an embodiment of the present disclosure will be described below in detail with reference to FIGS. 4-10. The method comprises following steps.

Figure 4:
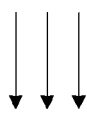
FIGS. 4-10 are cross-sectional views of intermediate statuses of a flash memory formed in steps of a method for fabricating a flash memory according to an embodiment of the present disclosure.
Figure 4:
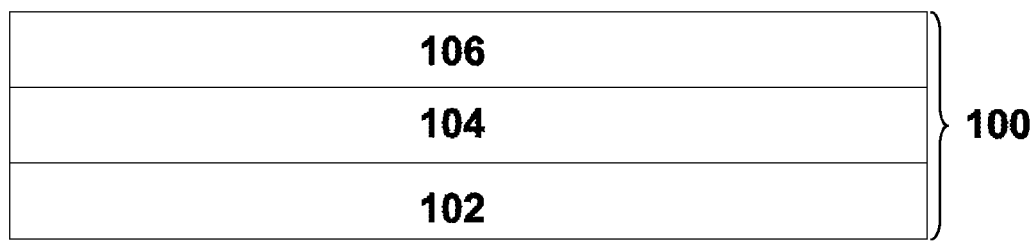

Step S1: a semiconductor substrate 100 is provided and first type heavily doped. In this embodiment, the semiconductor substrate 100 is the SOI substrate, on which the whole device is formed to help to reduce the electric leakage of the substrate and enhance the electrical performance of the device. As shown in FIG. 4, the SOI substrate 100 comprises from bottom to top: an insulation layer 102, a buried oxide layer 104 and a silicon layer 106. The silicon layer 106 is ion implanted and annealed to be n-type heavily doped, so as to reduce the series resistance of the back electrode.

Figure 5:
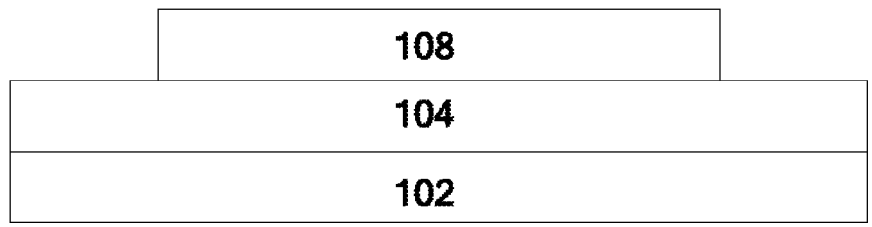

In this embodiment, after the step S1, the method further comprises etching the silicon layer 106 of the SOI substrate 100 to form a plurality of active regions isolated from each other, as shown in FIG. 5, that is, one memory cell is formed in one active region in following steps, and a plurality of memory cells isolated from each other may be formed on the whole semiconductor substrate 100 and arranged in an array.

Figure 6:
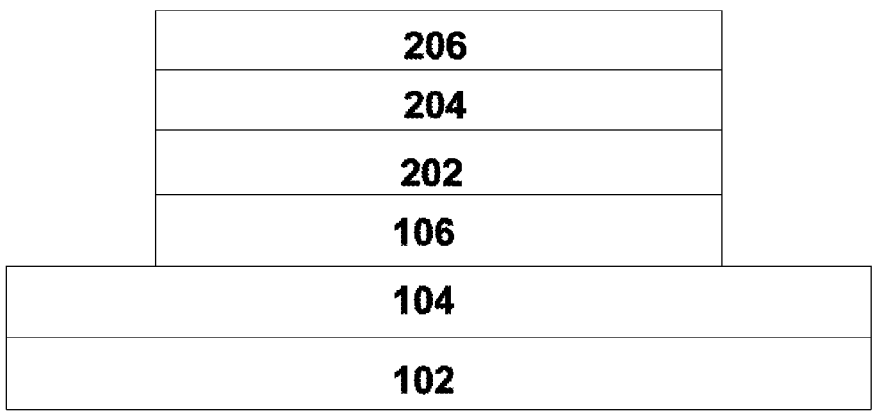

Step S2: a tunneling oxide layer 202, a silicon nitride layer 204 and a blocking oxide layer 206 are formed on the semiconductor substrate 100 sequentially. That is, a storage medium layer 200 (ONO) is formed. Specifically, an oxide material such as silicon oxide is deposited on the silicon layer 106, followed by photoresist coating, photolithography, etching and photoresist removing to form the tunneling oxide layer 202. Then, the silicon nitride layer 204 and the blocking oxide layer 206 are formed by similar processes, as shown in FIG. 6.

Figure 7:
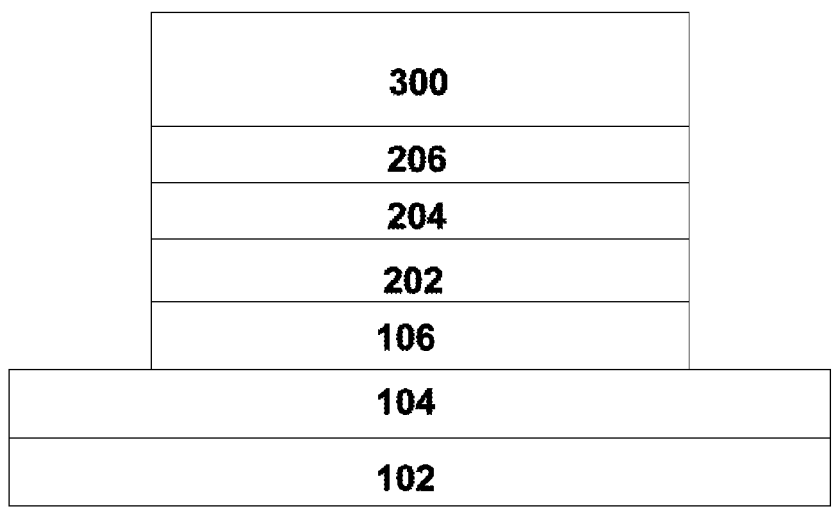

Step S3: a semiconductor layer 300 is formed on the blocking oxide layer 206 and second type lightly doped. In this embodiment, the semiconductor layer 300 may be a silicon layer and is formed on each active region. Specifically, a semiconductor material such as silicon is deposited on the blocking oxide layer 206, followed by photoresist coating, photolithography, etching and photoresist removing to form the semiconductor layer 300 on each active region. Then, the semiconductor layer 300 is ion implanted and annealed to be p-type light doped, as shown in FIG. 7. The semiconductor layer 300 may be an amorphous material layer deposited by plasma enhanced chemical vapor deposition and may be followed by a heat treatment, such as laser annealing, to form a polycrystalline material layer for enhancing the carrier mobility of the channel region.

Figure 8:
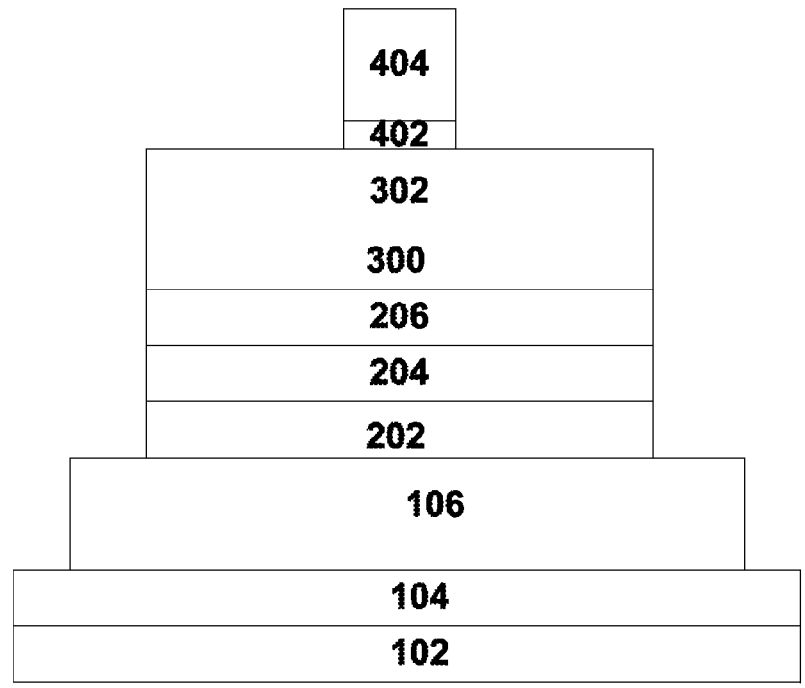

Step S4: a gate stack is formed on the semiconductor layer 300. The gate stack comprises a gate dielectric 402 and a gate 404 formed on the gate dielectric 402, and a region of the semiconductor layer 300 covered by the gate stack is a channel region 302. Specifically, a gate dielectric material is deposited on the semiconductor layer 300, followed by photoresist coating, photolithography, etching and photoresist removing to form the gate dielectric 402. In this embodiment, a material of the gate dielectric 402 may include, but are not limited to, silicon oxide or a high k dielectric such as hafnium oxide. A gate material is deposited on the gate dielectric 402, followed by photoresist coating, photolithography, etching and photoresist removing to form the gate 404, as shown in FIG. 8. In this embodiment, a material of the gate 404 may include, but are not limited to, polysilicon or a metal.

Figure 9:
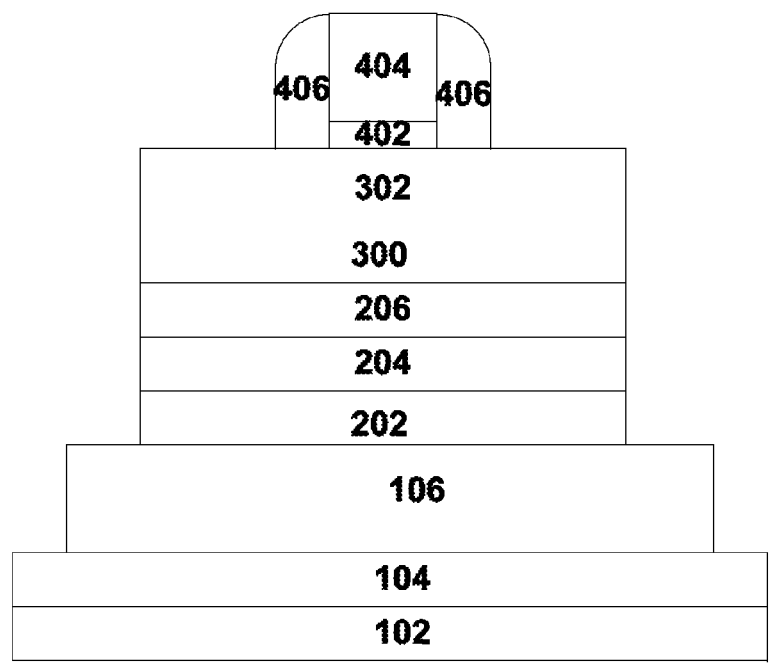

In this embodiment, after the step S4, the method further comprises forming a side wall 406 on each side of the gate stack. Particularly, a protective dielectric may be deposited, followed by dry etching to form the side wall 406 on each side of the gate stack. The protective dielectric may comprise silicon nitride, silicon oxide, silicon oxynitride, silicon carbide, fluorine doped silica glass, a low k dielectric (such as silicon carbonitride or carbon-doped silicon oxynitride), or a combination thereof, as shown in FIG. 9.

Figure 10:
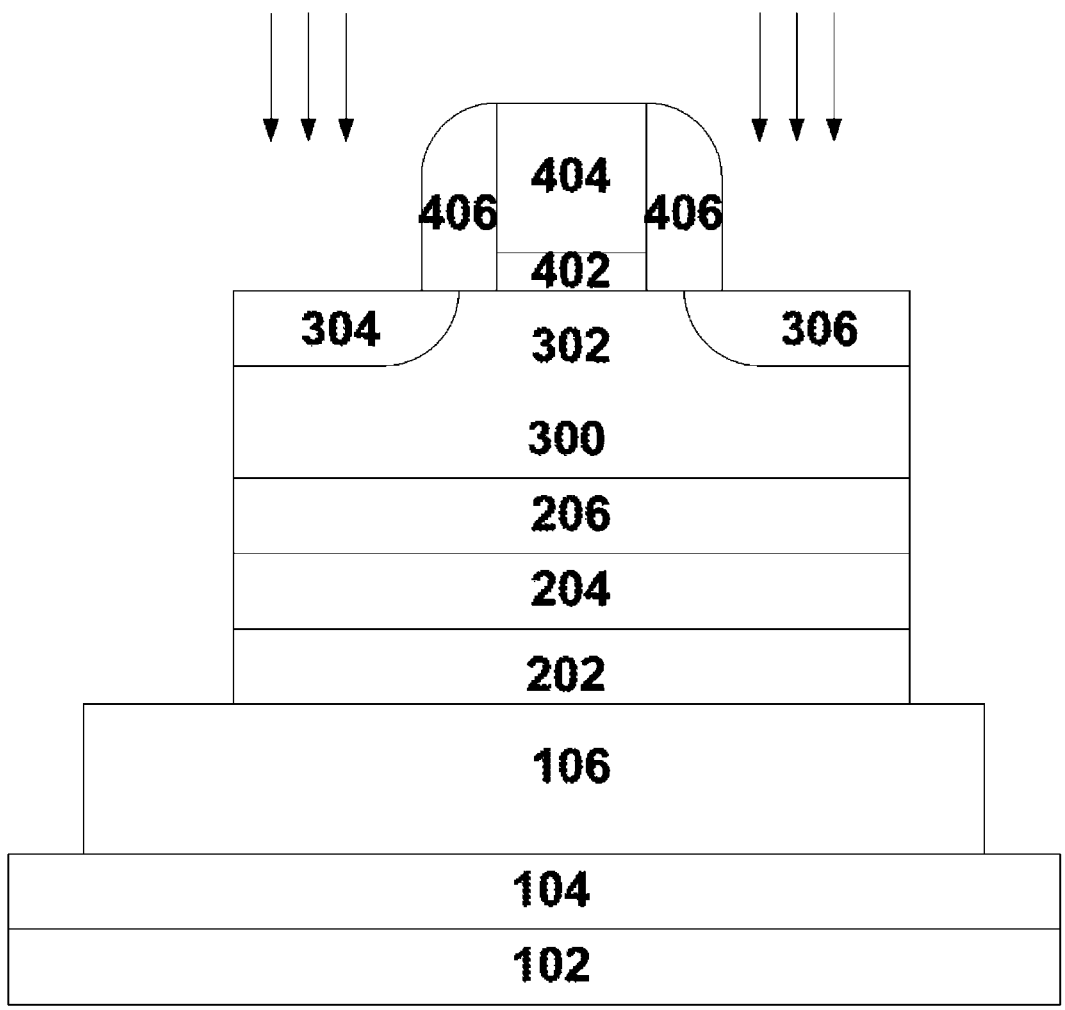

Step S5: the exposed semiconductor layer 300 is first type heavily doped to form a source region 304 and a drain region 306 on both sides of the channel region 302 respectively. In this embodiment, the exposed semiconductor layer 300 is ion implanted and annealed to be n-type heavily doped, as shown in FIG. 10.

In this embodiment, after the step S5, the method further comprises following steps.

Step S6: a passivation layer 500 is formed on the semiconductor substrate 100, the semiconductor layer 300 and the gate 404, and a plurality of holes 502 are formed in the passivation layer 500 by photolithography and etching, which lead to the semiconductor substrate 100, the semiconductor layer 300 and the gate 404 respectively.

Step S7: a plurality of metallic interconnections 600 are formed on the passivation layer 500, which are connected to the semiconductor substrate 100, the source region 304 and the drain region 306 of the semiconductor layer 300 and the gate 404 via the plurality of holes 502 respectively, as shown in FIGS. 2-3. Preferably, before the Step S6, metal silicide is formed on each of the semiconductor substrate 100, the source region 304 and the drain region 306, and the gate 404, to reduce contact resistances between a metal in the holes 502 and the semiconductor substrate 100, between the metal in the holes 502 and the source region 304 of the semiconductor layer 300, between the metal in the holes 502 and the drain region 306 of the semiconductor layer 300, and between the metal in the holes 502 and the gate 404 respectively.

With the flash memory and the method for fabricating the same according to an embodiment of the present disclosure, by forming the storage medium layer ONO between the semiconductor substrate and the channel region, the threshold voltage of the memory cell is changed by the substrate bias effect. Because a charge storage region (ONO) and an operation region of a transistor are separated in space, the operation region of the transistor may not interfere with the charge storage region, thus enhancing a reliability of the device and significantly increasing a data storage lifetime of the memory. Moreover, compared with the conventional SONOS flash memory, the flash memory according to an embodiment of the present disclosure has a smaller gate dielectric equivalent oxide thickness to help to scale down a size of the device.

Reference throughout this specification to "an embodiment", "some embodiments", "one embodiment", "an example", "a specific examples", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "an example", "a specific examples", or "some examples" in various places throughout this specification are not necessarily referring to the same embodiment or example of the disclosure. Furthermore, the particular features, structures, materials, or characteristics may be combined in any suitable manner in one or more embodiments or examples.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What we claim is:

1. A flash memory, comprising:
   a semiconductor substrate;
   a storage medium layer formed on the semiconductor substrate and comprising from bottom to top: a tunneling oxide layer, a silicon nitride layer and a blocking oxide layer;
   a semiconductor layer formed on the storage medium layer and comprising a channel region and a source region and a drain region located on both sides of the channel region respectively; and
   a gate stack formed on the channel region and comprising a gate dielectric and a gate formed on the gate dielectric,
   wherein the semiconductor substrate is first type heavily doped, the channel region is second type lightly doped, and the source region and the drain region are first type heavily doped.

2. The flash memory according to claim 1, wherein the semiconductor substrate is a silicon on insulator substrate.

3. The flash memory according to claim 1, wherein the semiconductor layer is a silicon layer.

4. The flash memory according to claim 2, wherein the silicon on insulator substrate is first type heavily doped.

5. The flash memory according to claim 1, wherein a side wall is formed on each side of the gate stack.

6. The flash memory according to claim 4, wherein a passivation layer is formed on the semiconductor substrate, the semiconductor layer and the gate, and a plurality of holes are formed in the passivation layer which lead to the semiconductor substrate, the semiconductor layer and the gate respectively.

7. The flash memory according to claim 6, wherein a plurality of metallic interconnections are formed on the passivation layer and are connected to the semiconductor substrate, the semiconductor layer and the gate via the plurality of holes respectively.

8. A method for fabricating a flash memory, comprising:
   S1: providing a semiconductor substrate, and first type heavily doping the semiconductor substrate;
   S2: forming a tunneling oxide layer, a silicon nitride layer and a blocking oxide layer on the semiconductor substrate sequentially;
   S3: forming a semiconductor layer on the blocking oxide layer, and second type lightly doping the semiconductor layer;
   S4: forming a gate stack on the semiconductor layer, wherein the gate stack comprises a gate dielectric and a gate formed on the gate dielectric, and a region of the semiconductor layer covered by the gate stack is a channel region; and
   S5: first type heavily doping the exposed semiconductor layer to form a source region and a drain region on both sides of the channel region respectively.

9. The method according to claim 8, wherein the semiconductor substrate is a silicon on insulator substrate and a silicon layer of the silicon on insulator substrate is first type heavily doped.

10. The method according to claim 9, after the step S1, further comprising: etching the silicon layer of the silicon on insulator substrate to form a plurality of active regions isolated from each other.

11. The method according to claim 9, wherein the semiconductor layer is a silicon layer.

12. The method according to claim 8, after the step S4, further comprising: forming a side wall on each side of the gate stack.

13. The method according to claim 8, after the step S5, further comprising:
   S6: forming a passivation layer on the semiconductor substrate, the semiconductor layer and the gate, and forming a plurality of holes in the passivation layer which lead to the semiconductor substrate, the semiconductor layer and the gate respectively; and
   S7: forming a plurality of metallic interconnections on the passivation layer, which are connected to the semiconductor substrate, the semiconductor layer and the gate via the plurality of holes respectively.

\* \* \* \* \*